United States Patent
Park

(10) Patent No.: US 9,966,397 B2
(45) Date of Patent: *May 8, 2018

(54) PIXEL, PIXEL ARRAY, IMAGE SENSOR INCLUDING PIXEL ARRAY, AND METHOD OF DRIVING PIXEL ARRAY HAVING A CAPACITOR

(75) Inventor: Seong Hyung Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 772 days.

This patent is subject to a terminal disclaimer.

(21) Appl. No.: 14/111,618

(22) PCT Filed: Apr. 29, 2011

(86) PCT No.: PCT/KR2011/003241
§ 371 (c)(1),
(2), (4) Date: Dec. 30, 2013

(87) PCT Pub. No.: WO2012/141371
PCT Pub. Date: Oct. 18, 2012

(65) Prior Publication Data
US 2014/0117205 A1    May 1, 2014

(30) Foreign Application Priority Data

Apr. 13, 2011  (KR) .................. 10-2011-0034450

(51) Int. Cl.
*H01L 27/00* (2006.01)
*H01L 27/146* (2006.01)
*H04N 5/355* (2011.01)

(52) U.S. Cl.
CPC .. *H01L 27/14612* (2013.01); *H01L 27/14609* (2013.01); *H01L 27/14643* (2013.01); *H04N 5/3559* (2013.01); *H04N 5/35572* (2013.01)

(58) Field of Classification Search
CPC .......... H01L 27/1461; H01L 27/14612; H01L 27/14609; H04N 5/35572; H04N 5/35581; H04N 5/3559
(Continued)

(56) References Cited

U.S. PATENT DOCUMENTS

| 5,559,553 A | 9/1996 | Bitek |
| 6,504,141 B1 * | 1/2003 | Kozlowski .......... H01L 27/1465 250/208.1 |

(Continued)

FOREIGN PATENT DOCUMENTS

| JP | 2008-305983 A | 12/2008 |
| KR | 10-2006-0088697 A | 8/2006 |

(Continued)

OTHER PUBLICATIONS

International Search Report in International Application No. PCT/KR2011/003241, filed Apr. 29, 2011.

(Continued)

*Primary Examiner* — Thanh Luu
*Assistant Examiner* — Kevin Wyatt
(74) *Attorney, Agent, or Firm* — Saliwanchik, Lloyd & Eisenschenk

(57) ABSTRACT

Provided are a pixel, a pixel array, an image sensor including the pixel array, and a method of driving the pixel array. The pixel includes a photoelectric converter, a capacitor, and a switching element. The capacitor accumulates electric charges converted by the photoelectric converter. The switching element outputs a potential of the capacitor. The switching element includes a transfer switching element transferring the electric charges, converted in the photoelectric converter, to the capacitor. The capacitor serves as a storage through multi-clocking of the transfer switching element.

20 Claims, 3 Drawing Sheets

(58) Field of Classification Search
USPC .................................................... 250/208.1
See application file for complete search history.

(56) References Cited

U.S. PATENT DOCUMENTS

| | | | |
|---|---|---|---|
| 6,512,544 B1* | 1/2003 | Merrill | H01L 27/1443 250/208.1 |
| 7,622,699 B2* | 11/2009 | Sakakibara | G01J 1/44 250/208.1 |
| 2005/0224843 A1* | 10/2005 | Boemler | H01L 27/14603 257/233 |
| 2005/0269482 A1 | 12/2005 | Hopper et al. | |
| 2006/0028568 A1* | 2/2006 | Takeda | H04N 5/2353 348/294 |
| 2006/0103749 A1* | 5/2006 | He | H04N 5/2355 348/308 |
| 2006/0249731 A1 | 11/2006 | Ladd | |
| 2007/0285544 A1* | 12/2007 | Yamada | H04N 5/37452 348/294 |
| 2008/0036888 A1* | 2/2008 | Sugawa | H04N 3/1568 348/294 |
| 2008/0105909 A1* | 5/2008 | Ham | H01L 27/14609 257/292 |
| 2008/0164404 A1 | 7/2008 | Mansoorian | |
| 2011/0090385 A1* | 4/2011 | Aoyama | H01L 27/14603 348/308 |
| 2012/0256077 A1* | 10/2012 | Yen | H01L 27/14609 250/208.1 |
| 2013/0027565 A1* | 1/2013 | Solhusvik | H04N 5/335 348/187 |

FOREIGN PATENT DOCUMENTS

| | | |
|---|---|---|
| KR | 10-2007-0034485 A | 3/2007 |
| KR | 10-2007-0035906 A | 4/2007 |

OTHER PUBLICATIONS

Office Action dated Jan. 14, 2013 in Korean Application No. 10-2011-0034450, filed Apr. 13, 2011.

Office Action dated May 29, 2014 in Taiwanese Application No. 10-0115209.

* cited by examiner

[Fig. 1]
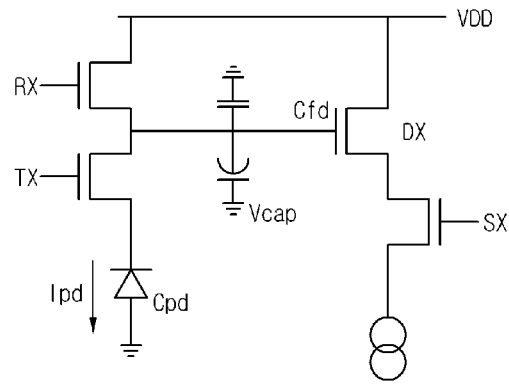
[Fig. 2]
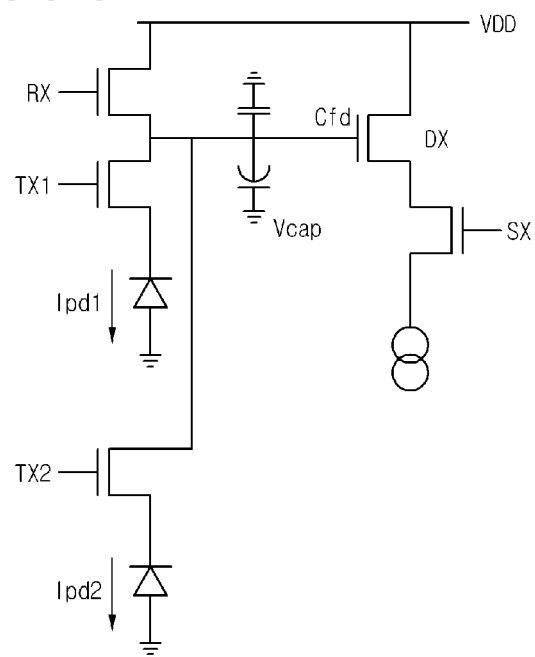
[Fig. 3]
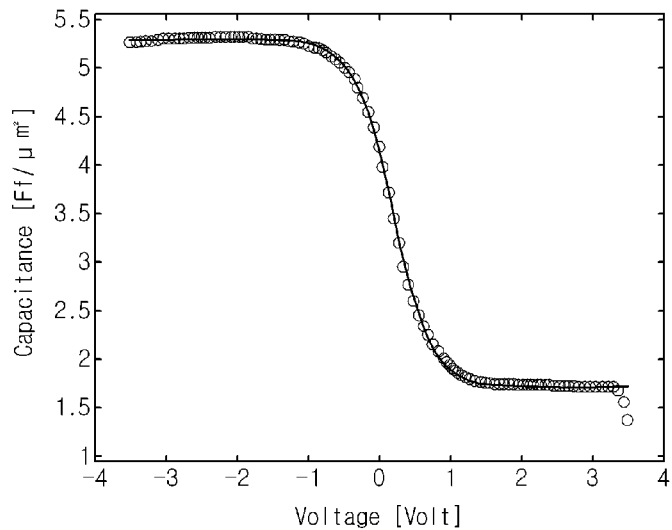

[Fig. 4]
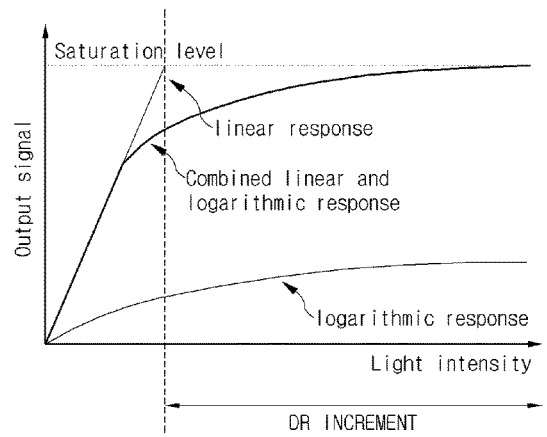
[Fig. 5]
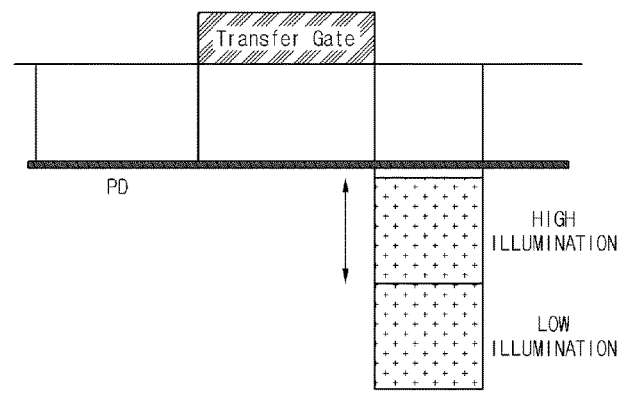
[Fig. 6]
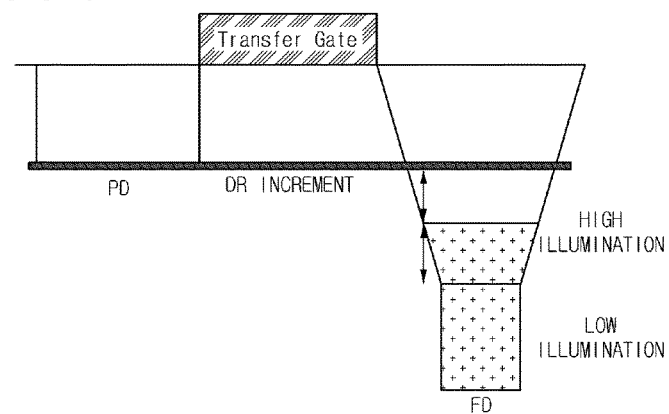
[Fig. 7]
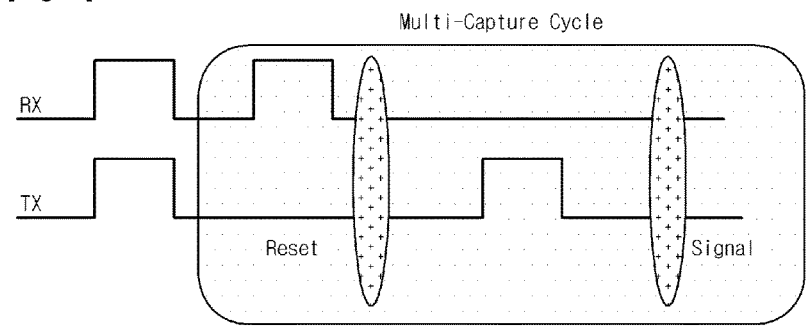

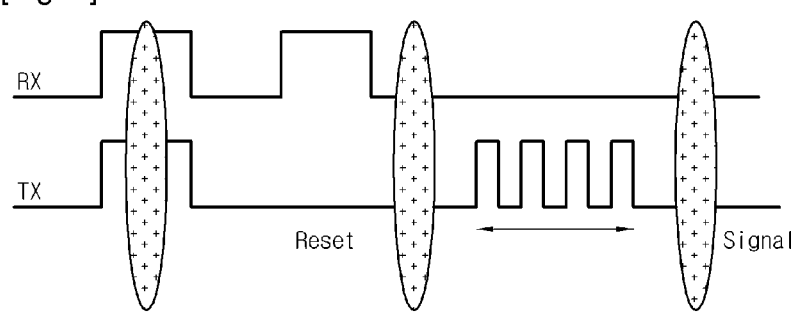
[Fig. 8]

PIXEL, PIXEL ARRAY, IMAGE SENSOR INCLUDING PIXEL ARRAY, AND METHOD OF DRIVING PIXEL ARRAY HAVING A CAPACITOR

CROSS-REFERENCE TO RELATED APPLICATIONS

This application is the U.S. national stage application of International Patent Application No. PCT/KR2011/003241, filed Apr. 29, 2011, which claims priority to Korean Application No. 10-2011-0034450, filed Apr. 13, 2011, the disclosures of each of which are incorporated herein by reference in their entirety.

TECHNICAL FIELD

The present invention relates to a pixel, a pixel array, an image sensor including the pixel array, and a method of driving the pixel array.

BACKGROUND ART

A related art image sensor is provided with a pixel structure including a photodiode and a transistor. A pixel having such a structure causes electricity to flow by exciting electrons of the photodiode with incident light, and the amount of electricity varies according to light intensity. Thus, a shutter switch is turned on after a predetermined period of time, and a signal is then transmitted to a sense node, thus obtaining a video signal.

However, a signal level is determined according to the capacity of a condenser of the sense node, but a related art sense node has fixed condenser capacity. Therefore, an image sensor has a reduced dynamic range and cannot perform auto-exposure. Thus, an image signal processing block performs the auto-exposure by determining to adjust a sensor exposure time or by applying a gain of a video signal.

To solve the above limitation, there has been proposed a technique in which a varactor using a MOS capacitor is employed so that the dynamic range of the image sensor is expanded by controlling the condenser capacitor of the varactor.

However, this related art has the limitation that the capacitance is formed only when external biasing is applied to the gate of the varactor, which makes it difficult to perform self-biasing control.

Furthermore, a row gate driver is required to control the gate of the varactor according to the related art, and metal lines for connecting them are additionally required, thus lowering an effective fill factor.

DISCLOSURE OF INVENTION

Technical Problem

Meanwhile, in the related art, a dual-capture technology to perform reading under low illumination and high illumination has been proposed. However, an image sensor employing the dual capture structure according to the related art needs to read an image at least twice, thus failing to achieve high frame rates.

Solution to Problem

Embodiments provide a pixel, a pixel array, an image sensor including the pixel array, and a method of driving the pixel array, enabling multi-capture while maintaining a flame rate even within a small photodiode (PD).

Embodiments also provide a pixel, a pixel array, an image sensor including a pixel array, and a method of driving a pixel array, which include a varactor capacitor being self-biased In one embodiment, a pixel includes: a photoelectric converter; a capacitor for accumulating electric charges converted in the photoelectric converter; and a switching element for outputting a potential of the capacitor, the switching element including a transfer switching element for transferring the electric charges, converted in the photoelectric converter, to the capacitor, wherein the capacitor serves as a storage through multi-clocking of the transfer switching element.

In another embodiment, a pixel array includes the pixel as an array.

In further another embodiment, an image sensor includes the pixel array.

In still further another embodiment, a method of driving a pixel array includes: accumulating electric charges converted in a photoelectric converter to a capacitor; and outputting a potential of the capacitor from a switching element, wherein the switching element includes a transfer switching element for transferring electric charges converted in the photoelectric converter to the capacitor, and the capacitor acts as a storage through multi-clocking of the transfer switching element.

The details of one or more embodiments are set forth in the accompanying drawings and the description below. Other features will be apparent from the description and drawings, and from the claims.

BRIEF DESCRIPTION OF DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 1 is a circuit diagram of a pixel array according to a first embodiment;

FIG. 2 is a circuit diagram of a pixel array according to a second embodiment;

FIG. 3 illustrates an example of actual measured values associated with characteristics of a varactor capacitor in a pixel array according to an embodiment;

FIG. 4 is a sensitivity graph illustrating an output signal according to light intensity;

FIG. 5 illustrates an Floating Diffusion (FD) potential according to the related art;

FIG. 6 illustrates the self-biasing of a varactor capacitor in a pixel array according to an embodiment; and FIGS. 7 and 8 are read-out timing diagrams in a pixel array according to an embodiment.

MODE FOR THE INVENTION

Reference will now be made in detail to the preferred embodiments of the present invention, examples of which are illustrated in the accompanying drawings. Wherever possible, the same reference numbers will be used throughout the drawings to refer to the same or like parts.

In the description of embodiments, it will be understood that when a layer (or film), region, pattern or structure is referred to as being on another layer (or film), region, pad or pattern, the terminology of on and under includes both the meanings of directly and indirectly. Further, the reference about on and under each layer will be made on the basis of drawings.

In the drawings, the thickness or size of each layer is exaggerated, omitted, or schematically illustrated for convenience in description and clarity. Also, the size of each element does not entirely reflect an actual size.

Embodiment

FIG. 1 is a circuit diagram of a pixel and a pixel array according to a first embodiment, and FIG. 2 is a circuit diagram of a pixel and a pixel array according to a second embodiment.

A pixel, a pixel array, and an image sensor including the same, according to an embodiment, include a photoelectric converter; a capacitor for accumulating electric charges converted in the photoelectric converter; and a switching element for outputting the potential of the capacitor. The switching element includes a transfer switching element for transferring electric charges, converted in the photoelectric converter, to the capacitor. Through the multi-clocking of the transfer switching element, the capacitor may act as a storage.

Furthermore, a pixel, a pixel array and an image sensor including the same, according to an embodiment, may include a photoelectric converter; a capacitor for accumulating electric charges converted in the photoelectric converter; a variable capacitor connected to the capacitor and having capacitance varied according to the potential of the capacitor; and a switching element for outputting the potential of the capacitor.

The above embodiment, although not limited thereto, may be applied to a Wide Dynamic Range (WDR) pixel, a pixel array and an image sensor including the pixel array.

The photoelectric converter may include a photodiode (PD), a photogate, and the like, and the capacitor may be a floating diffusion (FD) region; however, they are limited to the description.

The switching element may include a transfer switching element provided between the photoelectric converter and the capacitor to transfer electric charges in the photoelectric converter to the capacitor, a reset switching element provided between a power voltage line and the capacitor to reset the potential of the capacitor, and an output switching element connected to the power voltage line to output the potential of the capacitor. However, the switching element is not limited thereto.

For example, the transfer switching element may include a transfer transistor (Tx), the reset switching element may include a reset transistor (Rx), and the output switching element may include a source follower driving transistor (Dx); however, they are not limited thereto.

The variable capacitor is electrically connected to the capacitor, and the variable capacitor, although not limited thereto, may be a varactor capacitor.

For example, a pixel, a pixel array and an image sensor including the same, according to an embodiment, may include a photoelectric converter formed on a substrate, a transistor disposed on the substrate at one side of the photoelectric converter, a capacitor formed on the substrate at one side of the transistor, and a varactor capacitor formed on the capacitor. Here, the varactor capacitor (Vcap) may be self-biased.

Although VTr-CIS is illustrated in FIG. 1 by way of example, it is not limited thereto.

For example, the transistor may include a transfer transistor (TX) provided at one side of the photoelectric converter, a reset transistor (Rx) provided at one side of the transfer transistor (TX), a source follower driving transistor (DX), a select transistor (SX) and the like; however, it is not limited thereto.

According to the embodiment, the varactor capacitor may be connected so as to increase in capacitance as the potential of the FD region increases. For example, in FIG. 1, the varactor capacitor within a pixel may be implemented by connecting one node of the varactor capacitor (Vcap) to the capacitor, for example, to the FD region or a gate of the source follower (SF) driving transistor (DX) while connecting the other node to a P-Sub substrate.

Furthermore, FIG. 2 illustrates an example of a capacitor-shared structure.

According to an embodiment, the photoelectric converter may include a first photoelectric converter and a second photoelectric converter. The switching element includes a first transfer switching element for transferring electric chares, converted in the first photoelectric converter, to the capacitor, and a second transfer switching element for transferring electric charges, converted in the second photoelectric converter, to the capacitor. The first transfer switching element and the second transfer switching element may be connected to be electrically shared with the capacitor and the variable transistor.

For example, according to an embodiment, a first transfer transistor (TX1) and a second transfer transistor (TX2) are provided. The first transfer transistor (TX1) and the second transfer transistor (TX2) share the FD region, and the varactor capacitor (Vcap) has both nodes of an FD node and a P-sub node to operate normally. In such a manner, the embodiment may be applied to any shared structure such as 4-shared, 6-shared and 8-shared structures.

For example, according to the embodiment, the varactor capacitor is used to automatically create additional capacity without external biasing control with respect to changes in the potential of the FD region, so that sensitivity is maintained under low illumination and the capacity of the FD region is increased under high illumination, thus exhibiting the ideal Lin-Log sensitivity of the Wide Dynamic Range (WDR).

FIG. 3 illustrates an example associated with actual measured values of characteristics of a varactor capacitor in a pixel array according to an embodiment.

In the embodiment, the varactor capacitor, although not limited thereto, may be a PMOS varactor capacitor.

As shown in FIG. 3, as the bias decreases, the value of capacitance increases several times. According to this principle, in the case of the PMOS, P-sub electrons need to be gathered in the vicinity of a channel at approximately 3 V to approximately 1 V (almost flat band voltage). However, since they are minority carriers, electrons are not easily filed up in the vicinity of the channel, thus resulting in a low level of MOS capacitance (MOSCAP). However, when voltage exceeds the flat band voltage, holes, which are majority carriers, are gathered. In this case, the profile of channel carriers becomes very sharp, thus making it possible to increase MOSCAP.

$$C(v) = C_0 + C_1 \times \tan h(V_{GB} - V_{C1}/N_{C1}) \qquad \text{Equation 1}$$

As shown in Equation 1, the overall capacitance is determined by $\tan h(V_{GB})$. In this case, since there is no source/drain junction capacitance (CAP) in normal MOSCAP, dominant characteristics with respect to gate biasing are shown, thus increasing controllability.

In the embodiment, the varactor capacitor, although not limited thereto, may be a PMOS varactor; however, it is not limited thereto.

In the case where the varactor capacitor is a PMOS varactor, since a P-sub substrate is subjected to p-type doping, junction doping or poly gate doping may also be performed without difficulties in process.

FIG. 4 is a sensitivity graph showing an output signal according to light intensity.

Most of existing WDRs are expanded by the addition of a capacitor to an RF region, and this may increase detectable light intensity but impairs sensitivity.

Meanwhile, in the embodiment, the method of using the varactor allows high sensitivity to be maintained under low illumination and achieves an increase in FD CAP only under high illumination. This increases capacitance in Log scale and thus results in Log scale output. Accordingly, the most ideal Lin-Log scale sensitivity can be implemented.

FIG. 5 is a view illustrating an FD potential according to the related art, and FIG. 6 is an exemplary view of the self biasing of a varactor capacitor in a pixel and a pixel array according to an embodiment.

In the embodiment, to achieve full transfer for charge dumping without charge sharing, the top of the FD potential needs to be greater than the bottom of the FD potential.

FIG. 5 illustrates FD potential under normal circumstances according to the related art. In contrast, FIG. 6 is an exemplary view illustrating the self biasing of a varactor capacitor in a pixel array according to an embodiment. FIG. 6 illustrates that the capacitance of the capacitor automatically changes as potential decreases due to electrons being filed up in the FD node of the varactor capacitor. In FIGS. 5 and 6, the high illumination may be approximately 1 V, and the low illumination may be approximately 2.5 V; however, they are limited thereto.

FIGS. 7 and 8 are Read-Out timing diagrams in a pixel array according to an embodiment.

An image sensor adopting a dual capture structure according to the related art needs to read each image at least twice, thus failing to achieve high frame rates.

According to the embodiment, the switching element includes the transfer switching element for transferring electric charges, converted in the photoelectric converter, to the capacitor, and the capacitor may serve as a storage through the multi-clocking of the transfer switching element using the variable capacitor.

For example, when the varactor being self-biased is used as in the embodiment, the FD region may serve as a storage just through Tx multi-clocking, and electrons of the photodiode can thus be read several times, thereby implementing an image in a multi-capture manner.

For example, according to the embodiment, the FD node may be additionally used as a kind of memory. Thus, through the multi-clocking of the transfer transistor (Tx), an image can be implemented in the multi-capture manner while a flame rate is maintained even in a small photodiode.

According to the embodiment, after PD refresh, the photodiode (PD) is emptied in reset and signal readout cycle (i.e., multi-capture cycle) while electron information is filed up in the FD region. For this reason, the actual capacity of the PD appears to increase, thus expanding the dynamic range (DR) under high illumination.

Thus, according to the embodiment, the use of the varactor capacitor may allow the FD region to act as storage even through the multi-clocking of the transfer transistor (TX).

According to the present invention, there may be provided a pixel, a pixel array, an image sensor including the pixel array and a method of driving the pixel array, capable of enabling multi-capture while maintaining a flame rate even in a small photodiode.

For example, according to the embodiment, the FD node may be additionally used as a kind of memory. Thus, through the multi-clocking of the transfer transistor (Tx), an image can be implemented in the multi-capture manner while a flame rate is maintained even within a small photodiode.

Furthermore, there may be provided a pixel, a pixel array, an image sensor including the pixel array and a method of driving the pixel array, including a varactor capacitor being self-biased.

For example, according to the embodiment, the varactor capacitor is used to automatically create additional capacity without external biasing control with respect to changes in the potential of the FD region, so that sensitivity is maintained under low illumination and the capacity of the FD region is increased under high illumination, thus exhibiting the ideal Lin-Log sensitivity of the Wide Dynamic Range (WDR).

The features, structures, effects, etc., as set forth above, may be included in at least one embodiment but not necessarily limited to a single embodiment. Furthermore, the features, structures, effects, etc., exemplified in each embodiment may also be embodied in other embodiments through combinations or modifications by those skilled in the art. Accordingly, the contents associated with such modifications and combinations should be construed as falling within the scope of the embodiments.

While the invention has been particularly shown and described with reference to embodiments thereof, the embodiments should be considered in descriptive sense only and not for purpose of limitation. It will be apparent to those skilled in the art that various modifications and variations can be made in the present invention. For example, each element specified in the embodiments may be embodied in modified form. Thus, it is intended that the present invention covers the modifications and variations of this invention provided they come within the scope of the appended claims and their equivalents.

The invention claimed is:

1. A pixel comprising:
   a photoelectric converter;
   a capacitor accumulating electric charges converted in the photoelectric converter;
   a switching element outputting a potential of the capacitor, the switching element comprising a transfer switching element transferring the electric charges, converted in the photoelectric converter, to the capacitor; and
   a variable capacitor connected to the capacitor and having capacitance varied according to the potential of the capacitor,
   wherein the capacitor serves as a storage through multi-clocking of the transfer switching element,
   wherein the variable capacitor comprises a floating diffusion region,
   wherein the floating diffusion region comprises a top portion and a bottom portion directly disposed under the top portion,
   wherein the top portion of the floating diffusion region is physically wider than the bottom portion of the floating diffusion region, and
   wherein a floating diffusion potential of the top portion of the floating diffusion region is greater than that of the bottom portion of the floating diffusion region.

2. The pixel of claim 1, wherein the variable capacitor is self-biased.

3. The pixel of claim 2, wherein the variable capacitor is a p-type variable capacitor.

4. The pixel of claim 1, wherein the switching element further comprises an output switching element outputting the potential of the capacitor.

5. The pixel of claim 4, wherein the variable capacitor has one node connected to a gate of an output switching element or the capacitor or an output switching element, and the other node connected to a substrate.

6. The pixel of claim 1, wherein the switching element further comprises:
a reset switching element provided between a power voltage line and the capacitor to reset the potential of the capacitor; and
an output switching element connected to the power voltage line to output the potential of the capacitor.

7. The pixel of claim 1, wherein the capacitor is shared.

8. The pixel of claim 7, wherein the photoelectric converter comprises a first photoelectric converter and a second photoelectric converter.

9. The pixel of claim 8, wherein the transfer switching element comprises a first transfer switching element transferring electric charges, converted in the first photoelectric converter, to the capacitor.

10. The pixel of claim 9, wherein the transfer switching element further comprises a second transfer switching element transferring electric charges, converted in the second photoelectric converter, to the capacitor.

11. The pixel of claim 10, wherein the first transfer switching element and the second transfer switching element are electrically shared with the capacitor.

12. A pixel array comprising the pixel of claim 1 as an array.

13. An image sensor comprising the pixel array of claim 12.

14. The pixel of claim 1, wherein the variable capacitor is electrically connected to the capacitor.

15. A pixel comprising:
a photoelectric converter;
a capacitor accumulating electric charges converted in the photoelectric converter;
a switching element outputting a potential of the capacitor, the switching element comprising a transfer switching element transferring the electric charges, converted in the photoelectric converter, to the capacitor; and
a variable capacitor connected to the capacitor,
wherein the variable capacitor is electrically connected to the capacitor,
wherein the variable capacitor comprises a floating diffusion region, and
wherein the floating diffusion region comprises a top portion and a bottom portion directly disposed under the top portion,
wherein the top portion of the floating diffusion region is physically wider than the bottom portion of the floating diffusion region, and
wherein a floating diffusion potential of the top portion of the floating diffusion region is greater than that of the bottom portion of the floating diffusion region.

16. The pixel of claim 15, wherein the variable capacitor has capacitance varied according to the potential of the capacitor.

17. The pixel of claim 15, wherein the capacitor serves as a storage by the photodiode, which is emptied in reset and signal readout cycle after the photodiode is refreshed, through multi-clocking of the transfer switching element.

18. The pixel of claim 15, wherein the photoelectric converter comprises a first photoelectric converter and a second photoelectric converter.

19. The pixel of claim 18, wherein the transfer switching element comprises a first transfer switching element transferring electric charges, converted in the first photoelectric converter, to the capacitor.

20. The pixel of claim 19, wherein the transfer switching element further comprises a second transfer switching element transferring electric charges, converted in the second photoelectric converter, to the capacitor.

* * * * *